United States Patent [19]
Berger et al.

[11] Patent Number: 5,259,003
[45] Date of Patent: Nov. 2, 1993

[54] METHOD OF ENCODING TWO DIGITAL DATA SIGNALS

[75] Inventors: Toby Berger, Itchaca, N.Y.; Keith Jarett, Oakland, Calif.

[73] Assignee: Teknekron Communications Systems, Inc., Berkeley, Calif.

[21] Appl. No.: 789,731

[22] Filed: Nov. 8, 1991

[51] Int. Cl.$^5$ .......................... H04K 1/10; H04L 5/12; H04L 1/02; H04M 11/00

[52] U.S. Cl. ........................................ 375/38; 375/60; 375/100; 379/61; 371/37.8; 371/43

[58] Field of Search ................ 379/61; 375/38, 39, 375/60, 100; 371/43, 37.8

[56] References Cited

U.S. PATENT DOCUMENTS

| | | | |
|---|---|---|---|
| 4,616,364 | 10/1986 | Lee | 375/100 |
| 4,802,190 | 1/1989 | Immink | 375/38 |
| 4,993,046 | 2/1991 | Saito et al. | 375/39 |
| 5,058,134 | 10/1991 | Chevillat et al. | 375/39 |
| 5,101,418 | 3/1992 | Critchlow et al. | 375/38 |

Primary Examiner—Curtis Kuntz
Assistant Examiner—Vijay Shankar
Attorney, Agent, or Firm—Limbach & Limbach

[57] ABSTRACT

A method to encode two digital data signals is disclosed. Each of the digital signals is characterized by a bit stream. An N bit block from the first signal is mapped to a unique M bit third signal where M is greater than N. Further, the number of "0's" in the M bit third signal is less than M/2. The M bit third signal is transmitted in the event a bit from the second signal is 0, whereas the complement of the M bit third signal is transmitted in the event a bit from the second signal is 1.

14 Claims, 7 Drawing Sheets

METHOD OF ENCODING TWO DIGITAL DATA SIGNALS

TECHNICAL FIELD

The present invention relates to a method of encoding two digital data signals and more particularly to a method of encoding a digital control signal and a digital data signal for transmission over a noisy channel by the base unit to a remote unit of a digital cordless phone.

BACKGROUND OF THE INVENTION

Wireless communication between a base unit and one or more remote units is well known in the art. One well known method is Frequency Division Multiple Access (FDMA). In FDMA, the available electromagnetic communication spectrum is divided into a plurality of frequency channels. Communication between the base unit and one of the remote units is effected over one of the frequency channels. Communication between the base unit and a different remote unit is effected over a different frequency channel.

Time Division Multiple Access (TDMA) is also well known in the art. In TDMA communication, transmission between the base unit and a first remote unit is effected over a first "slice" in time. Transmission between the base unit and a second remote unit is effected over a second "slice" of time, different from the first "slice".

Finally, in Code Division Multiple Access (CDMA) the communication between a base unit and one or more remote units is accomplished through spread spectrum transmission over a frequency range wherein a unique Pseudo Noise (PN) code distinguishes the communication between a base unit and a first remote unit and a different code distinguishes the communication between the base unit and a different remote unit. There are several types of CDMA systems such as Direct Sequence, Frequency Hopping, and Time-Hopping. Direct Sequence spread spectrum systems encode a low rate data stream into a high rate data stream at the transmitter. At the receiver the high rate data stream is decoded back into the low rate data stream.

Establishment of protocol between a remote unit and a base unit prior to the communication session is well known in the modem communication art. Thus, for example, in packet communications, prior to the communication session in accordance with the X.25 protocol the remote unit and the base unit negotiate the packet size. In addition, in the modem communication art, modems having different transmission rate capabilities determine, prior to the communication session, the fastest speed at which both units can accommodate one another.

In the prior art, it is known that the transmit power can be adjusted based on a priori knowledge of the transmitted power and the expected received power by the other side. However, this prior art is normally limited in that it assumes a fixed channel attenuation.

In the prior art, it is also known to command adjust the dynamic power control by using a feedback loop. However, for a TDMA system, the delay that is composed of the measuring time, the transmission time and the application time results in large degradation. Also, the amount of message rate that needs to be allocated for power control is sometimes large which results in a loss of capacity.

SUMMARY OF THE INVENTION

In the present invention a method of encoding two digital data signals is disclosed. The two digital data signals comprise a first signal and a second signal to be transmitted over a noisy channel wherein each signal is characterized by a bit stream. N bits from the first signal are mapped to a unique M bit third signal where M is greater than N and wherein the number of "1's" in the M bit signal is less than M/2. This M bit third signal is transmitted in the event a bit from the second signal is "0", whereas the complement of this M bit third signal is transmitted in the event a bit from the second signal is "1".

DETAILED DESCRIPTION OF THE DRAWINGS

Figure 1:
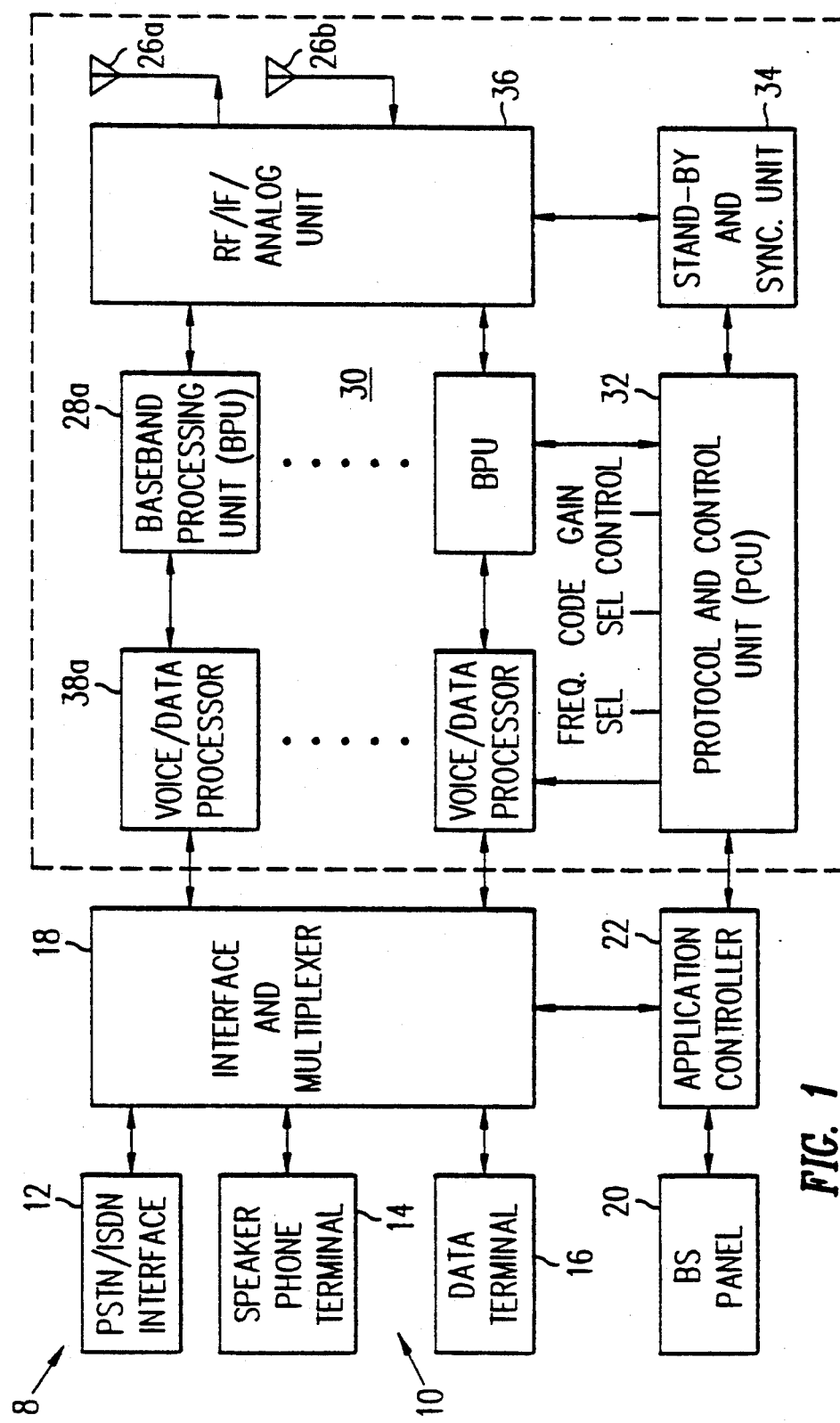
FIG. 1 is a block level diagram of a base unit of the present invention.

Referring to FIG. 1 there is shown a block level diagram of a base unit 10. The base unit 10 is adapted to communicate with one or more remote units 40 shown in FIG. 2. In the preferred embodiment, collectively the base unit 10 and the remote unit 40 comprise a digital cordless phone 8. Thus, the base unit 10 has an interface 12 for connection with a public switch telephone network (PSTN) such as an RJ11 jack or an ISDN interface.

The PSTN portion of the interface 12 handles PSTN telephone actions, such as on/off hook, multi-tone generation etc. The signals received by the interface 12 are sent to the interface and multiplexer 18 and to the application controller 22.

The ISDN portion of the interface 12 translates ISDN messages into corresponding signals such as on/off hook echo, DTMF tone echo, dial tone or signaling messages such as ringing.

The base unit 10 is hardwired to communicate with the telephone switching network and communicates wirelessly with one or more remote units 40. The base unit 10 also comprises a speaker phone terminal 14.

Thus, with a speaker phone terminal 14, the base unit 10 can also be used to communicate directly with the telephone network through the PSTN/ISDN interface 12 or wirelessly with one or more remote units 40. In addition, the base unit 10 comprises a data terminal interface 16 for receiving digital data for communication to the telephone network over the PSTN/ISDN interface 12 or wirelessly with one or more remote units 40. Thus, for example, data from sources such as a computer, can be supplied to the base unit 10 at the data terminal interface 16 for transmission and reception over the telephone network through the PSTN/ISDN interface 12 or wirelessly with one or more remote units 40.

The PSTN/ISDN interface 12, the speaker phone terminal 14 and the data terminal interface 16 are all connected to an interface and multiplexer 18. The interface and multiplexer 18, shown in greater detail in FIG. 6, serves to interface the various signals received from the speaker phone terminal 14 and the data terminal 16 and places them on the telephone network through the PSTN/ISDN interface 12 or to be transmitted to one or more of the remote units 40.

The base unit 10 also comprises a panel 20 comprising of lights and switches, and a keypad. The signals from the panel 20 are supplied to an application controller 22 and the signals from the application controller are supplied to the panel 20. The application controller 22 is shown in greater detail in FIG. 7.

The application controller 22 interfaces with the interface and multiplexer 18. The function of the application controller 22 is to interface with the user of the system 8, to interpret the user commands, entered from the panel 20, and to provide responses from the system 8 to the user.

The interface and multiplexer 18 and the application controller 22 communicate with the base unit transceiver 30. The base unit transceiver 30 comprises a system clock 35, a protocol and control unit 32, a standby and sync unit 34, an RF/IF analog unit 36, and at least one combination of voice/data processor 38a and its associated base band processing unit 28a. In the base unit 10, there are as many voice/data processors 38a and its associated base band processing unit 28a as there are the number of remote units 40 which is or are served simultaneously by the base unit 10. Thus, if the base unit 10 is adapted to service three (3) remote units 40 simultaneously, then within the transceiver 30 are three voice/data processors 38 each with its associated base band processing unit 28.

Each of the voice/data processors 38 is connected with its associated base band unit 28. The voice data processor 38 is also connected to the interface and multiplexer 18 and with the protocol and control unit 32. The base band processing unit 28 is connected to the RF/IF analog unit 36 and with the protocol and control unit 32.

The RF analog unit 36 is connected to the standby and sync unit 34. In addition, the RF/IF unit 36 is connected to a pair of antenna 26a, and 26b, with each of the antennas 26a and 26b serving to both transmit and receive.

Finally, the protocol and control unit 32 is connected to the application controller 22.

Figure 2:
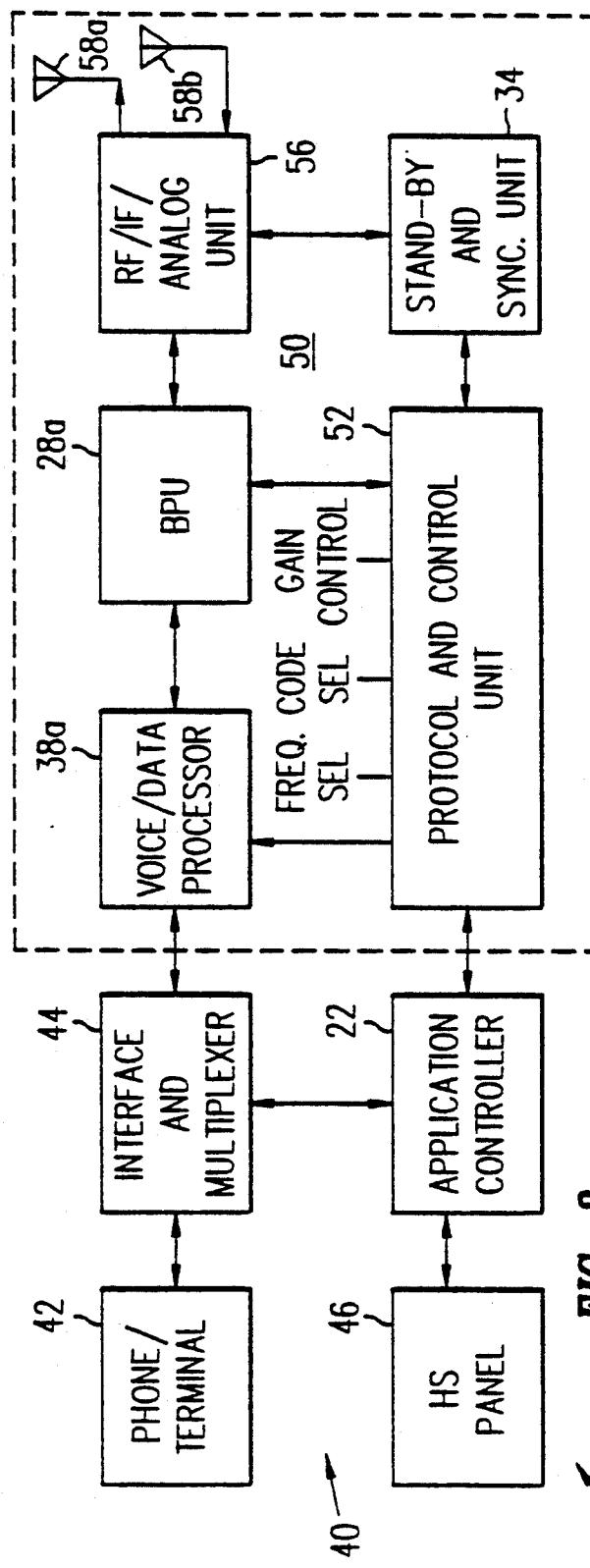
FIG. 2 is a block level diagram of a remote unit of the present invention.

The remote unit 40 is shown in block diagram form in FIG. 2. The remote unit 40 comprises a phone/terminal 42 which comprises a handset and an interface terminal to receive data. The phone terminal 42 is connected to an interface and multiplexer 44 which is similar to the interface and multiplexer 18 of the base unit. The remote unit also comprises a handset panel 46. The handset panel 46 has lights and switches. The handset panel 46 communicates with an application controller 22 which is similar to the application controller 22 in the base unit 10. Similar to the base unit 10, the application control 22 is connected to the interface and multiplexer 44.

The remote unit 40 also comprises a remote unit transceiver 50. The remote unit transceiver 50, similar to the base unit transceiver 30, comprises a protocol and control unit 52 which is similar to the protocol and control unit 32 of the base unit 10.

The remote unit transceiver 50 also comprises a standby and sync unit 34, which is same as the standby and sync unit 34 of the base unit 10. The remote unit transceiver 50 also comprises an RF/IF analog unit 56, which is similar to the RF/IF analog 36 of the base unit transceiver 30, and is connected to a transmitting and receiving antenna 58a and a receiving antenna 58b.

The remote unit transceiver 50 also comprises a single voice data processor 38a and its associated base band processing unit 28a. The voice/data processor 38 and its associated base band processing unit 28a are same as the voice/data processor 38a and its associated base band processing unit 28a of the base unit transceiver 30.

The remote unit transceiver 50 thus comprises a protocol and control unit 52, a standby and sync unit 34, an RF/IF analog unit 56, a voice/data processor 38a and a base band processing unit 28a. The connection of these units is identical to the connection for the components of the base unit transceiver 30. The protocol and control unit 52 is connected to the application controller 22 and to the voice/data processor 38a and the base band unit 28a, and to the standby and sync unit 34. The voice/data processor 38a is connected to the base band processing unit 28a and to the interface and multiplexer 44. The base band processing unit 28a is connected to the RF/IF analog unit 56. The RF/IF analog unit 56 is connected to the standby and sync unit 34 and to the antennas 58a and b.

Figure 3:
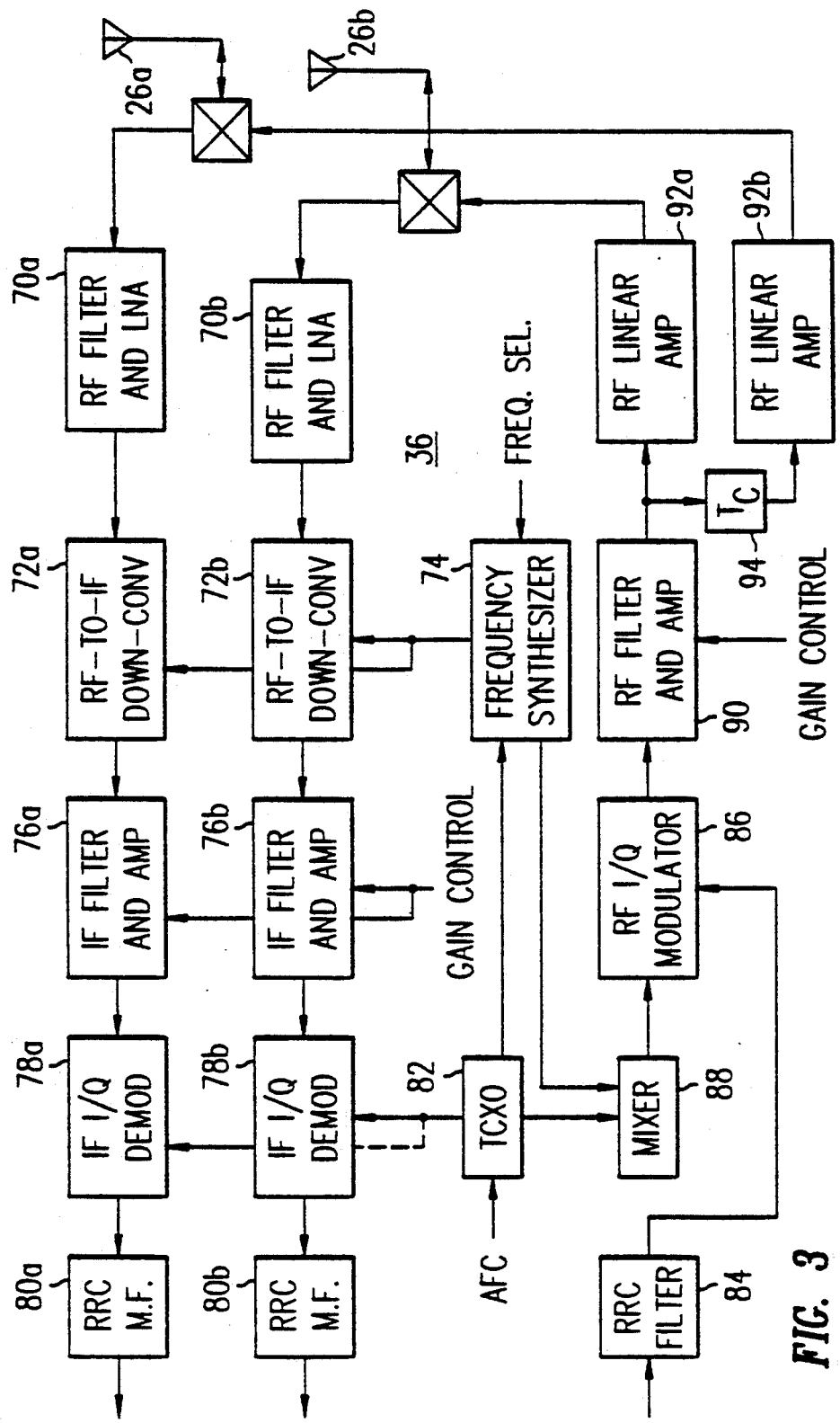
FIG. 3 is a detailed block level diagram of the RF/IF analog portion of the base unit shown in FIG. 1.

Referring to FIG. 3 there is shown a detailed block diagram of the RF/IF analog unit 36 of the base unit transceiver 30. The function of the RF/IF analog unit 36 is to convert the frequency of the transmitted or received signal by the antenna 26a and 26b from radio frequency to an intermediate frequency. In addition, the unit 36 has power control capability to control the transmission power of the transmitted signal. Finally, the unit 36 modulates and demodulates the in-phase and quadrature-phase components of the base band signal.

The unit 36 is shown as comprising two sets of antennas 26a and 26b both for transmitting and for receiving. The use of two antennas 26(a and b) and two sets of matching circuits is to insure that in case one antenna is located in a "dead spot" that the other antenna would receive and transmit the requisite signals to the remote unit 40. The signal received by one of the antennas 26a is supplied to an RF filter and low noise amplifier (LNA) 70a, which functions to filter and amplify the signal received from the antenna 26a. The output of the RF filter and LNA 70a is supplied to an RF-to-IF down converter 72a. The function of the RF-to-IF down converter 72a is to convert the received RF signal into an intermediate frequency signal. The conversion from RF-to-IF is dependent upon the difference frequency supplied to the RF-to-IF down converter 72a. This difference frequency is generated by a frequency synthesizer 74 based upon a frequency select input signal.

From the RF-to-IF down converter 72a, the intermediate frequency is then supplied to an IF filter and amplifier 76a. The function of the IF filter and amplifier 76a is to filter the received IF signal and to amplify that signal. In addition the IF filter and amplifier 76a increases the gain of the filtered signal based upon a gain control signal supplied thereto.

The amplified and filtered IF signal is then supplied to an I/Q demodulator 78a. The I/Q demodulator 78a is an in-phase and quadrature-phase demodulator and generates as its output thereof a base band frequency signal. The demodulation of the input signal is based upon a IF frequency signal supplied from a temperature compensated crystal oscillator 82. The base band frequency signal is then supplied to an RRC MF 80a. The RRC MF 80a is a root raised cosine signal matched filter whose output, in the absence of carrier phase error, is a positive or a negative impulse signal for each of the in-phase and quadrature-phase components of the signal. The in-phase and quadrature-phase components comprises a complex signal.

Similarly, the signal from the antenna 26b is supplied along a second identical circuit. First, the signal from the antenna 26b is supplied to an RF filter and a LNA circuit 70b. The output of the RF filter and LNA circuit 70b is supplied to an RF-to-IF down converter 72b. The difference frequency generated by the frequency synthesizer 74 is supplied to the RF-to-IF down converter 72b. The output of the RF-to-IF down converter 72b is supplied to an IF filter and amplifier 76b, whose gain is also controlled by the same gain control signal, supplied to the IF filter and amplifier 76a.

The signal from the IF filter and amplifier 76b is then in-phase and quadrature-phase demodulated by the IF I/Q demodulator 78b. The in-phase and quadrature-phase demodulation is based upon the IF frequency signal supplied from the temperature compensated crystal oscillator 82. The output of the IF I/Q demodulator 78b is supplied to the RRC MF circuit 80b.

In the transmission phase, the ±1 binary signals corresponding to the in-phase and quadrature-phase components of the "spread" data signal (to be described in greater detail hereinafter) are supplied to the RRC filter 84. The RRC 84 serves to generate a positive or negative root raised cosine signal if the input signal is a +1 or −1 respectively. The output of the RRC filter 84 is supplied to an RF I/Q modulator 86. The RF I/Q modulator 86 takes the root raised cosine signal and directly converts it into a radio frequency modulated signal for transmission. The output of the frequency synthesizer 74 which determines the selected radio frequency signal to be modulated and the output of the TCXO 82 which determines the RF frequency of the modulation are both supplied to a mixer 88. The output of the mixer 88 is then supplied to the RF I/Q modulator 86 and is modulated by the output of the RRC filter 84.

The output of the RF I/Q modulator 86 is then supplied to an RF filter and amplifier 90, whose amplification portion has a gain which is controlled by the gain control signal. The output of the RF filter and amplifier 90 is supplied to the RF linear amplifier 92a for transmission over the antenna 26b. In addition, the output of the RF filter and amplifier 90 is supplied after a delay of "chip" time $T_c$, by a delay 94, to a second RF linear amplifier 92b for transmission over the antenna 26a. Since two signals are produced (one delayed from the other), the signals can be received by the remote unit 40 and combined. Further, since the two signals are delayed, this permits the remote unit 40 to receive both signals using only a single antenna.

The frequency synthesizer 74 generates a difference frequency between the RF and IF frequencies. The difference frequency varies depending upon the frequency select signal supplied to the synthesizer 74. Thus, the frequency synthesizer 74 covers all frequency bands. In the event the synthesizer 74 can generate both the difference frequency (supplied to the RF to IF converter 72) and the selected RF frequency for transmission, and is able to switch rapidly between those signals, then the mixer 88 is not required. In that event, the selected RF frequency output of the synthesizer 74 can be supplied directly to the RF I/Q modulator 86.

Figure 4:
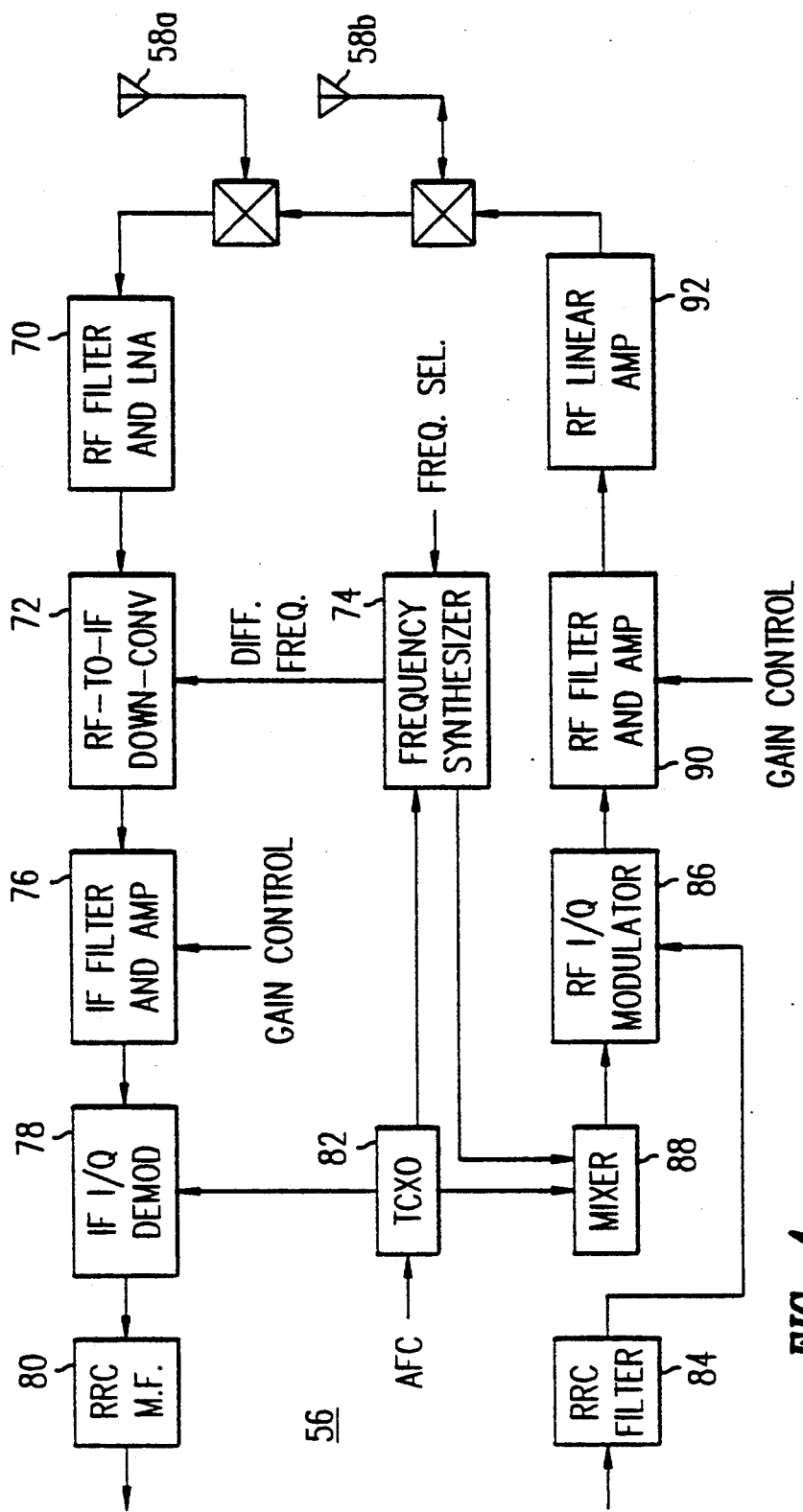
FIG. 4 is a detailed block level diagram of the RF/IF analog portion of the remote unit shown in FIG. 2.

Referring to FIG. 4, there is shown in detailed block level diagram the RF/IF analog unit 56 of the remote transceiver unit 50. Similar to the RF/IF analog unit 36, the RF/IF analog unit 56 comprises an antenna 58a or 58b for receiving the incoming signal. The received signal is supplied to an RF filter and low noise amplifier 70 which serves to filter and amplify the received RF signal. From the RF filter and LNA circuit 70, the signal is supplied to a RF-to-IF down converter 72. The RF-to-IF down converter 72 converts the received RF signal into an intermediate frequency signal based upon the difference frequency signal generated by the frequency synthesizer 74. The difference frequency signal generated by the frequency synthesizer 74 can be selected by a frequency select signal. From the RF-to-IF down converter 72, the IF signal generated thereby is supplied to an IF filter and amplifier 76, whose gain is controlled by a gain control signal. The output of the IF filter and amplifier 76 is then supplied to an IF I/Q demodulator 78.

The IF I/Q demodulator 78 also receives a IF frequency signal generated by the temperature compensated crystal oscillator 82. The demodulated in-phase and quadrature-phase signals from the IF I/Q demodulator 78 are then supplied to an RRC matched filter 80. The output of the RRC matched filter 80, in the absence of carrier phase error, are positive or negative impulses representing a ±1 binary signal for each of the in-phase and quadrature-phase components of the signal.

The transmission portion of the RF/IF analog unit 56 receives the "spread" signal from the base band processing unit 28a. The signal is supplied to the RRC filter 84. The output of the RRC filter 84 is a positive or negative root raised cosine signal which is generated in response to a ±1 binary in-phase or quadrature-phase component of the "spread" signal. The output signal of the RRC filter 84 is supplied to an RF I/Q modulator 86. The output of the oscillator 82 and of the frequency synthesizer 74 are both supplied to a mixer 88 which generates the requisite RF modulation signal which is supplied to the RF I/Q modulator 86. Thus, the output of the RF I/Q modulator 86 is an RF modulated signal which is supplied to an RF filter and amplifier 90. The RF filter and amplifier 90 has a amplifier whose gain is controlled by the gain control signal. The output of the RF filter and amplifier 90 is supplied to the RF linear amplifier 92 which is then supplied to a transmitting antenna 58b for transmission.

Figure 5A:
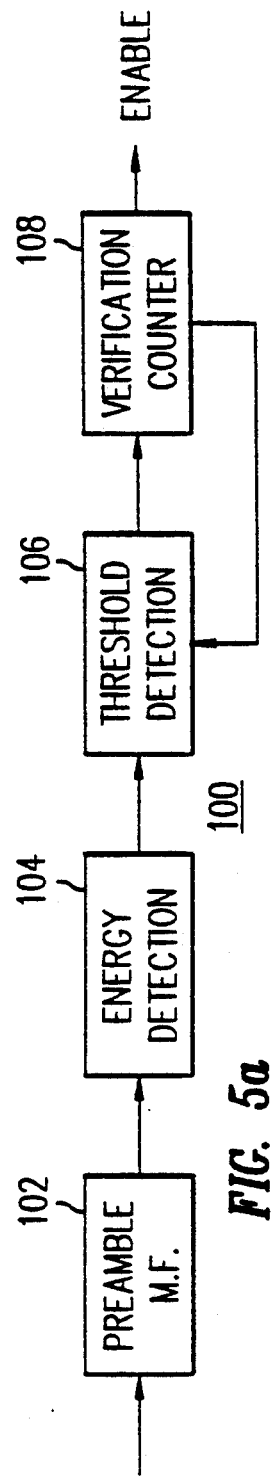
FIGS. 5(a-c) are portions of the block level diagram of the standby and sync unit of the remote unit shown in FIG. 2 and the base unit shown in FIG. 1.
Figure 5B:
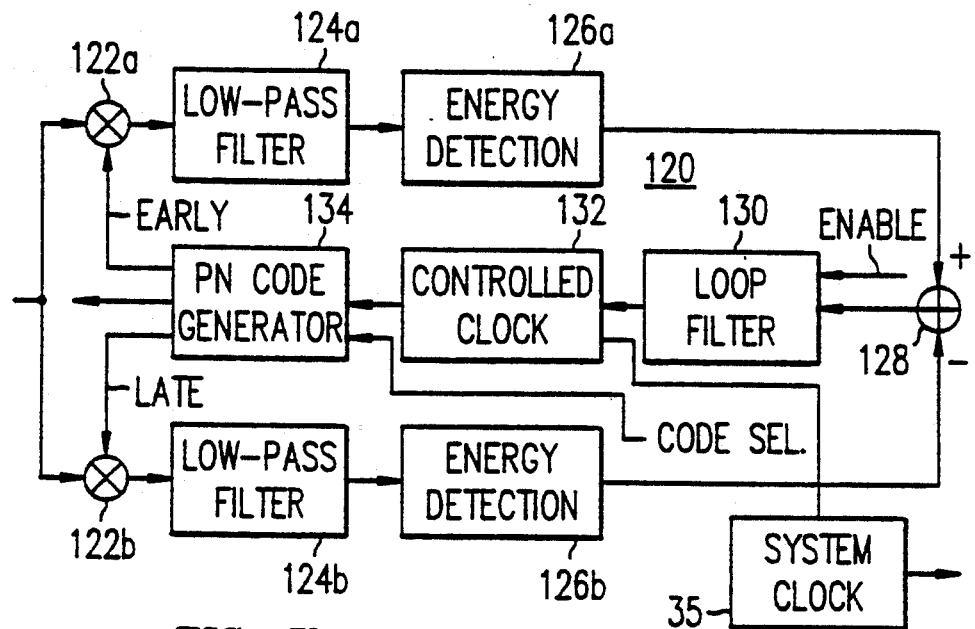
Figure 5C:
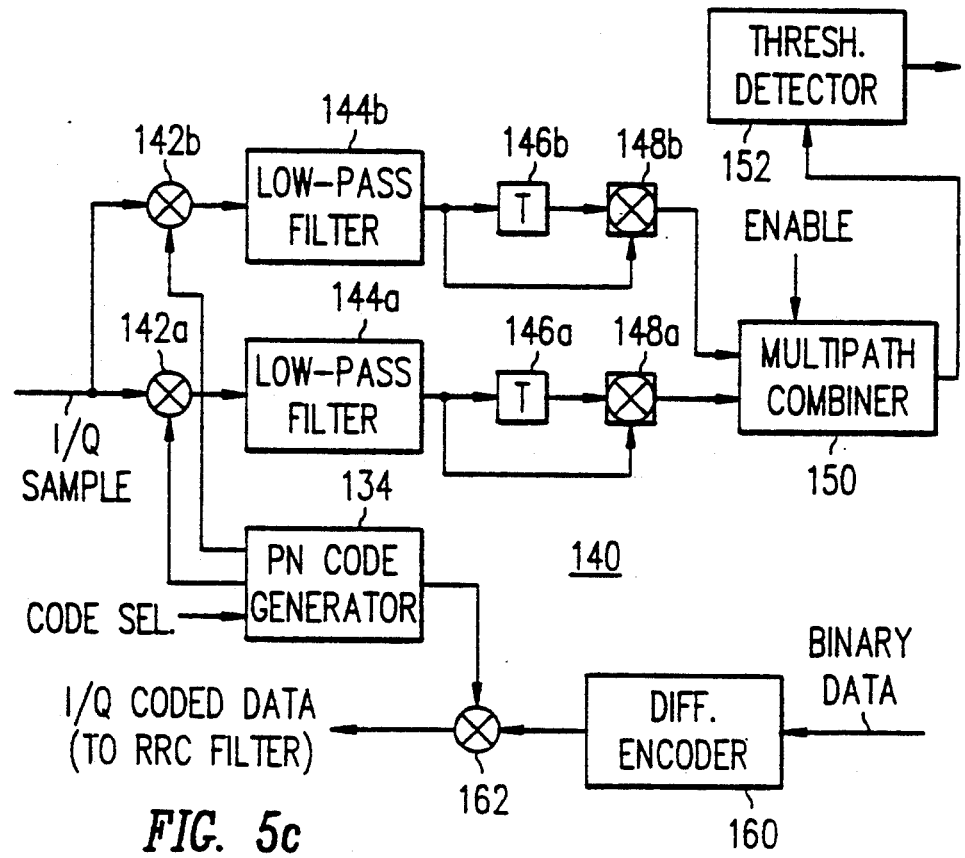

Referring to FIGS. 5(a–c) there is shown detailed schematic block level diagram of the standby and sync unit 34. The standby and sync unit 34 comprises a portion which acquires and verifies the signal (FIG. 5a)

synchronizes the signal (FIG. 5b) and detects the signal (FIG. 5c).

Referring to FIG. 5a there is shown the acquisition and verification portion 100 of the standby and synchronization unit 34. The acquisition and verification unit 100 comprises a preamble matched filter 102 which receives as its input thereof, the output of the RRC MF circuit 80. The function of the preamble matched filter circuit 102 is to detect the preamble portion of SYNC signal generated by the base unit 34 or the preamble portion of the PA1 signal generated by the remote unit (discussed in greater detail hereinafter). The output of the preamble matched filter circuit 102 is supplied to an energy detection circuit 104. The energy detection circuit 104 serves to obtain the signal magnitude from the in-phase and quadrature-phase components. The output of the energy detection circuit 104 is supplied to a threshold detection circuit 106. The threshold detection circuit 106 serves to detect the presence or absence of the preamble signal. Typically the threshold is first high to prevent false detection and then lowered to increase the probability of detection. The output of the threshold detection circuit 106 is supplied to a verification counter 108. The verification counter 108 can optionally be fed back to the threshold detection circuit to control the threshold detection circuit in a feedback loop. The output of the verification counter 108 is an enable signal, which is used in the other components of the stand-by and sync unit 34. In the event the signal received by the RF/IF analog unit 36 or 56 is the correct signal, the enable signal would be high.

Referring to FIG. 5b there is shown the synchronization portion 120 of the standby and synchronization unit 34. The synchronization portion 120 comprises a Pseudo Noise (PN) code generator 134, which receives as its input thereof, a code select signal. The PN code generator 134 generates a PN code which is determined by the code select signal. In addition, it generates a code which is earlier in phase, by half a "chip" time $T_c$, than the code selected by the code select signal and is supplied to a first complex multiplier 122a. The PN code generator 134 also generates a code which is later in phase, by half a "chip" time $T_c$, than the one selected by the code select signal and is supplied to the second complex multiplier 122b.

The output of the RRC matched filter circuit 80 is supplied to the first and second complex multipliers 122a and 122b respectively. The outputs of the complex multipliers 122a and 122b are supplied to low pass filters 124a and 124b respectively. The outputs of the low pass filters 124a and 124b are supplied to energy detection circuits 126a and 126b respectively. The low pass filter and the energy detection circuit 126 (a and b) function to obtain the signal magnitude from the in-phase and quadrature-phase components. The output of the energy detection circuits 126a and 126b are supplied to a comparator 128. The output of the comparator 128 is a difference signal and is supplied to a loop filter 130. The enable signal from the verification unit 100 is also supplied to the loop filter 130. The loop filter is activated when the enable signal is high. The output of the loop filter 130 is supplied to a controlled clock 132 which is then supplied back to the PN code generator 134. In this manner, the PN code generator 134 is maintained in a synchronized state by a delay locked loop. The low pass filters 124 (a and b) have a bandwidth around the bit rate and may be implemented as an integrate and dump circuit. An integrate and dump circuit is a simple implementation of a low pass filter. The controlled clock 132 also drives a system clock 35.

Referring to FIG. 5c there is shown a modulating and demodulating portion 140 of the standby and sync unit 34. The modulator and demodulator portion 140 receives the signal from the RRC matched filter circuit 80. The signal is supplied to a first complex multiplier 142a. The output of the PN code generator 134 is also supplied to the first complex multiplier 142a. The output of the first complex multiplier 142a is supplied to a first low pass filter 144a. From the first low pass filter 144a, the signal is supplied to a first one bit delay 146a. The output of the first one bit delay 146a is supplied to a first conjugate multiplier 148a to which the output of the first low pass filter 144a is also supplied. The output of the first conjugate multiplier 148a is supplied to a multipath combiner 150. From the multipath combiner 150, the signal is supplied to a threshold detector 152 which generates the binary data signal.

The signal from the RRC MF circuit 80 is also supplied to a second path comprising of a second complex multiplier 142b which is also supplied with the output of the PN code generator 134. The output of the second complex multiplier 142b is supplied to a second low pass filter 144b. The output of the second low pass filter 144b is supplied to a second one bit delay 146b. The output of the one bit delay 146b is supplied to a second conjugate multiplier 148b to which the output of the second low pass filter 144b is also supplied. The output of the second conjugate multiplier 148b is supplied to the multipath combiner 150. In the case where the standby and sync unit 34 is used with the RF/IF analog unit 36 of the base unit transceiver 30, two paths for the signals from the two RRC MF circuits 80a and 80b are provided. In the event the standby and sync unit 34 is used with the RF/IF analog unit 56 of the remote unit transceiver 50, the multipath combiner 150 would be used if the base unit 10 transmitted two signals delayed from one another by a single chip.

The data detection portion 140 also comprises a differential encoder 160 which receives the binary data from the base band processing unit 28a. The output of the differential encoder 160 is supplied to a complex multiplier 162 to which the PN code generator 134 is also supplied. The output of the complex multiplier 162 is the "spread" signal which is supplied to the RRC filter 84 for transmission by the RF/IF analog unit 36 or 56.

The base band processing unit 28 is similar to the standby and sync unit 34 in that it comprises an acquisition and verification unit (shown in FIG. 5a), a synchronization unit (shown in FIG. 5b) and a data detection unit 140 shown in FIG. 5c. The difference, as will be explained hereinafter, is that the base band processing unit is operational during the time when the remote unit 40 is in communication with the base unit 10. In contrast, the standby and sync unit 34 is operational only when the remote unit 40 is in the standby mode. Because various components of the base band processing unit 28a are similar if not identical to the standby and sync unit 34, the base band processing unit 28a and the sync standby and sync unit 34 in the remote unit 40 may be combined into a single unit.

The voice/data processor 38a can be one of the well known CODEC standards. Thus, the voice processor portion of the voice/data processor 38a can be an ADPCM processor. In addition, as will be seen, each manufacturer of the remote unit 40 or the base unit 10 can supply proprietary voice codecs.

The protocol and control unit 52 is a microcomputer capable of storing a program and for executing thereof. In addition, it receives the signal from the system clock 54 or 35 and generates the requisite control signal such as frequency select signal, code select signal, and gain control signal.

Figure 6:
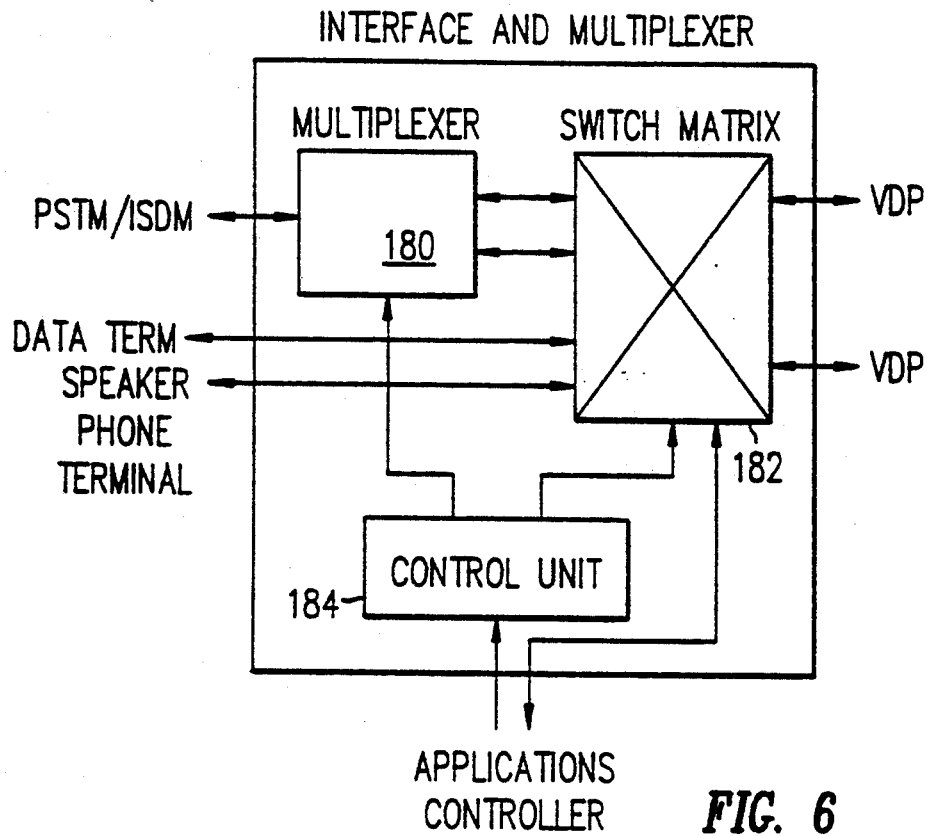
FIG. 6 is a detailed block level diagram of the interface and multiplexer portion of the remote unit shown in FIG. 2 and of the base unit shown in FIG. 1.

Referring to FIG. 6, there is shown a block level diagram of the interface and multiplexer 18. As previously discussed, the interface and multiplexer 44 is similar to the interface and multiplexer 18. The difference being that the interface and multiplexer 18 is connected to the PSTN/ISDN interface 12 for communication with the central office telephone network.

The interface 18 comprises a multiplexer 180 to which the signals to and from the PSTN/ISDN interface 12 communicate. The multiplexer 180 supplies as an output a signal to a switch matrix 182. The signals from the multiplexer 180, the data terminal 16, and the speaker phone terminal 14 are all supplied to a switch matrix 182. The switch matrix 182 is, as the name implies, a switch for switching the signals to be supplied to the voice/data processor 38a.

The switch matrix 182 connects the voice/data processor 38a either to the data terminal 16 or to the speaker phone terminal 14 for local connection to the remote units 40, or to the PSTN/ISDN interface 12 for connection by the remote units 40 to the telephone network. In addition, the switch matrix 182 can connect the data terminal 16 or the speaker phone 14 for connection by the base unit 10 to the telephone network.

The interface and multiplexer 18 also comprises a control unit 184 which supplies control signals to the multiplexer 180 to select the output thereof (either PSTN or ISDN signals) and to the switch matrix 182 to connect the signals to the voice/data processor 38a. The control unit receives commands from the application controller 22. In addition, the interface and multiplexer 18 receives tone generation signals (for PSTN lines) or signaling messages (for ISDN lines) directly from the application controller 22.

Figure 7:
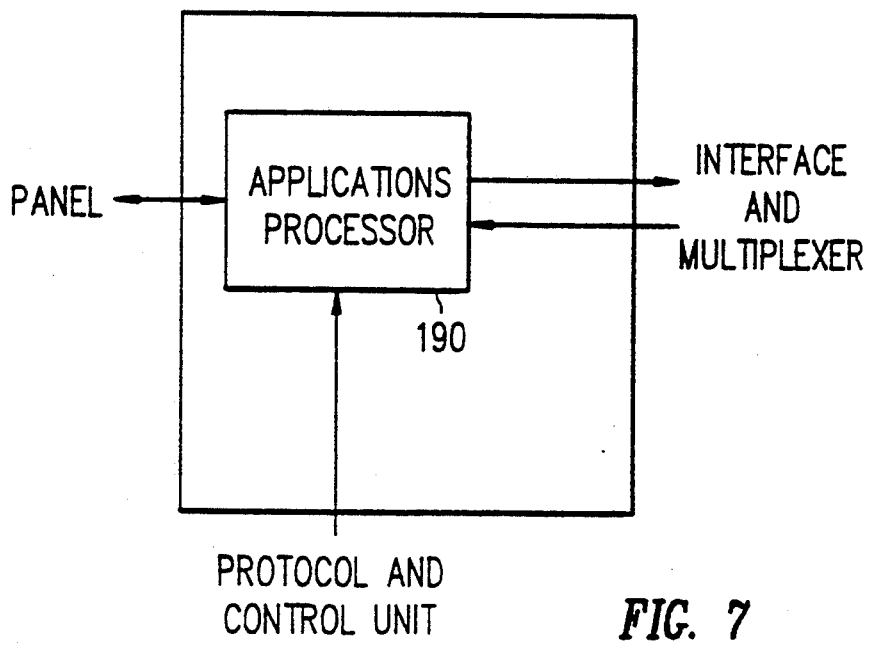
FIG. 7 is a detailed block level diagram of the application controller portion of the remote unit shown in FIG. 2 and of the base unit shown in FIG. 1.

Referring to FIG. 7, there is shown a block level diagram of the application controller 22. The application controller 22 comprises an applications processor 190. Data supplied from the Base Unit Panel 20 or Remote Unit Panel 46 is received by the applications processor 190. For input on the keys of the panel 20 or 46, the applications processor 190 sends signals to the PSTN/ISDN interface to either activate the appropriate row and column of the DTMF/Pulse generator (for PSTN lines) or format a signaling message (for the ISDN lines). In either case, the signals are sent to the switch matrix 182 of the interface and multiplexer 18.

For an outgoing call, the applications processor 190 receives either an off-hook signal from the BS panel 20 or an off-hook message from the Protocol and Control Unit 32 corresponding to a remote unit 40 requesting an outgoing call. The applications processor 190 signals the PSTN/ISDN interface 12 via the interface and multiplexer 18 to generate the appropriate signal (for PSTN lines) or message (for ISDN lines). A similar procedure is employed for signaling dialed digits.

For an incoming call, the PSTN/ISDN interface 12 will generate the audible alerting sound. An alerting message is sent via the interface and multiplexer 18 and applications controller 22 to the protocol and control unit 32 for alerting of the remote unit 40. When the call is answered the off-hook procedure described above is followed.

OPERATION

Figure 8:
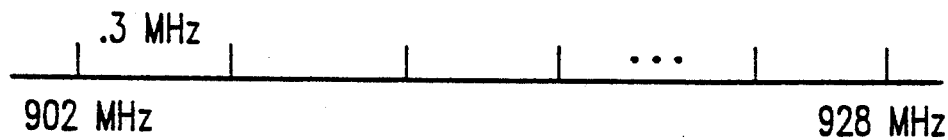
FIG. 8 is a schematic diagram of the frequency spectrum in which the preferred embodiment of the communication system of the present invention is intended to operate.

The operation of the communication system 8 comprising the base unit 10 and one or more remote units 40 will now be explained as follows. As previously described, the system 8 is particularly adapted to be used as a digital cordless phone and is suitable for operation in the electromagnetic radiation spectrum between 902 MHz and 928 MHz. This is shown in FIG. 8.

The frequency spectrum from 902 MHz to 928 MHz is divided into a plurality of frequency channels each having approximately 1.3 MHz bandwidth. Thus, approximately 20 frequency channels can be selected. Communication between base unit 10 and all of its associated remote units 40 is effective over one of the selected frequency channels.

Within the selected frequency channel, the base unit 10 and its associated remote units 40 communicate through the use of Pseudo Noise codes or PN codes using CDMA. Thus, for example, if a base unit 10 is in communication with a first remote unit 40a, the base unit 10 would transmit and receive in a selected frequency channel and would communicate with the remote unit 40a through a first PN code. In the event the base unit 10 is in simultaneous communication with a second remote unit 40b, the base unit 10 would communicate with the second remote unit in the same selected frequency channel but using a different PN code.

Figure 9:
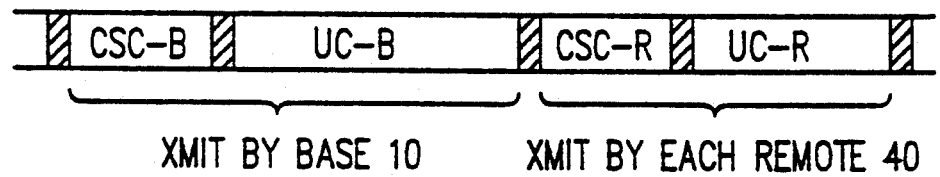
FIG. 9 is a timing diagram of the protocol of communication between the base unit and the remote unit.

Finally, communication between the base unit 10 and each remote unit 40 is accomplished using TDMA technique. Referring to FIG. 9, there is shown a timing diagram for the transmission and reception of signals from the base unit 10 to one or more of the remote units 40. Within a selected frequency channel, the base unit 10 transmits in a portion of time which comprises a Common Signaling Channel (CSC-B) portion, followed by a guard time, and a User Channel (UC-B) portion, followed by a guard time. Transmission by each of the remote units 40 is accomplished over the next period in time which comprises a Common Signaling Channel (CSC-R) portion shared by one or more of the remote units 40, followed by guard time, followed by a User Channel (UC-R) portion, followed by a guard time. This constitutes a frame. The sequence of timing relationship is then repeated with the base unit 10 transmitting in its slot of time followed by transmission by one or more of the remote units 40 in its slot of time.

Figure 10:
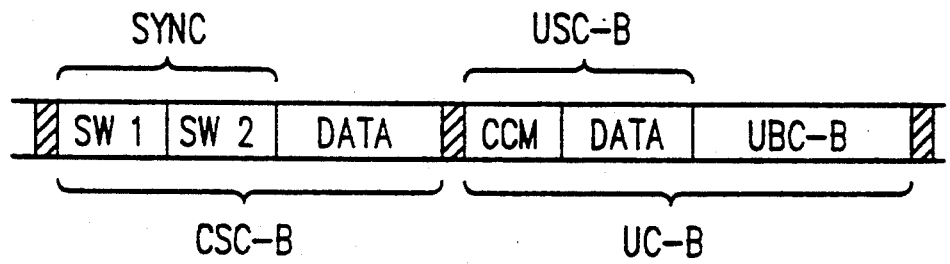
FIG. 10 is a detailed timing diagram of FIG. 9, showing the portion transmitted by the base unit.

Referring to FIG. 10, there is shown a detailed timing diagram of the various signals transmitted by the base unit. The CSC-B signal is further subdivided into a SYNC portion and a DATA portion. Within the SYNC portion, the signal is further subdivided into a SW1 and a SW2 signal. The SW1 signal is a synchronization signal. The SW1 signal is generated based upon a PN code that is unique to the base unit 10 and known by all the authorized remote units 40. As will be seen, the SW2 signal is either identical to SW1 or is the inverse of SW1. The DATA portion of CSC-B can contain signaling data such as the base unit 10 assigning a PN code to the remote unit 40 for communication between the base unit 10 and the remote unit 40 in the User Channel (UC-B and UC-R).

Within the UC-B portion of the signal transmitted by the base unit 10, the UC-B signal is further subdivided into a User Signaling Channel (USC-B) and a User Bearer Channel (UBC-B). The USC-B is further subdivided into a Channel Control Message (CCM) portion, which contains control information such as power control and a DATA field which contains control signal information such as signaling messages. In the case of a digital cordless phone, a signaling message can be the dialed digits. The UBC-B portion contains the message or the data to be transmitted from the base unit 10 to the remote 40.

In the preferred embodiment, since a message between the remote unit 40 and the base unit 10 can span many frames, the following definitions are used to delineate message boundaries. A normal frame, as previously discussed, consists of a CSC-B, UC-B, CSC-R and UC-R. A minor superframe consists of eight normal frames. A major superframe consists of sixteen (16) normal frames.

The relative polarity of the SW1 and SW2 signals serve to distinguish normal frame and minor superframe timing, in accordance with the following:

| SW1 | SW2 | TYPE OF FRAME |
|---|---|---|
| 0 | 0 | Normal |
| 0 | 1 | Minor Super |

Thus, the SYNC portion of CSC-B would consist of "00" every frame, and would consist of "01" every eight frames. To delineate the commencement of a major superframe, a message containing the frame number is transmitted by the base unit 10, in the DATA portion of the USC-B.

Figure 11:
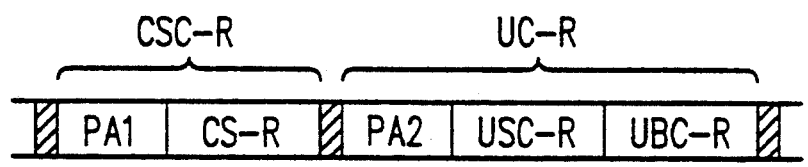
FIG. 11 is a detailed timing diagram of FIG. 9, showing the portion transmitted by the remote unit.

Referring to FIG. 11, there is shown a detailed timing diagram of the IF frequency signal portion transmitted by each of the remote units. The CSC-R portion is subdivided into a PA1 portion and CS-R portion. The PA1 portion is used for synchronization information. The CS-R portion functions as a control channel. The UC-R portion is subdivided into a PA2 portion, a USC-R portion, and a UBC-R portion. The PA2 portion is used for synchronization information. USC-R portion, is similar to the USC-B portion in that the field contains control information such as signal quality and signaling messages. Finally, the UBC-R portion is similar to the UBC-B portion transmitted by the base unit 10. The UBC-R portion is the data or the message transmitted by the remote 40 to the base unit 10.

ESTABLISHMENT OF COMMUNICATION LINK

For illustration purposes only, and by way of example, we shall assume that the base unit 10 is adapted to communicate with only a single remote unit 40. The establishment of a communication link between the base unit 10 and the remote unit 40 is as follows. The base unit 10 would transmit periodically the SYNC signal (comprising of SW1 and SW2) in the CSC-B portion of its allotted time slot. This would be affected over a selected frequency channel. Again, for illustration purposes only, we shall assume that the frequency selected is in the fourth frequency channel. The SYNC signal is also PN encoded (again for simplicity sake, we shall assume that the index of the code is equal to 0). Thus, periodically, within the fourth frequency channel, the SYNC signal (both SW1 and SW2) would be transmitted encoded with the index of the PN code equal to 0, by the base unit 10.

As is well know, a PN code is a sequence of chips. In the preferred embodiment, the PN code for the SYNC signal is $8 \times 32 = 256$ chips long with 128 chips for the in-phase signal and 128 chips for the quadrature-phase signal. For each phase there are 16 chips per bit. Thus there can be $2^{256}$ possible combinations of PN codes for the SYNC signal each having an index associated therewith. For example, the index of a PN code equal to zero might correspond to the PN code itself being "100 . . . 01".

The remote unit can be in one of three possible states: ON, STANDBY and OFF.

As the remote unit 40 is turned on, it would begin in the default state of looking for signals having a PN code with index equal to the index of the base unit PN code, i.e. in this case an index of zero (0). The remote unit 40 would scan the frequency spectrum starting at frequency channel equal to 0.

This is accomplished by the protocol and control unit 52 generating the frequency select signal to cause the synthesizer 74 to generate a difference frequency, so that the RF frequency in channel equal to zero (0) is converted to an intermediate frequency. The protocol and control unit 52 also generates a code select signal such that the PN code equal to index of zero (0) is generated by the PN code generator 134 of the SSU 34. The function of the preamble MF 102 of the SSU 34 is to look for the SYNC signal. If it is found, the enable signal is generated. If after a pre-determined period of time, the SYNC signal is not found, then the PCU 52 generates a different frequency select signal, moving to frequency channel equal to one.

Once the remote unit 40 reaches frequency channel equal four (4), and the SYNC signal is found, the remote unit 40 would transmit a request signaling message, in frequency channel equal to four (4) in the CS-R portion of CSC-R time frame. The transmission of the request signaling message by the remote unit 40 acknowledging the acquisition of the SYNC signal is also encoded in a PN code derived from the PN code whose index equals to zero (0).

In response to the receipt of the request signaling message signal received from the remote unit 40, the base unit 10 transmits an assignment signaling message signal for the PN code to be used in the UC transmission, (i.e. during the message or data exchange portion) between the base unit 10 and the remote unit 40. The transmission by the base unit 10 of this assignment signaling message signal is accomplished in the DATA portion of CSC-B timing portion and is encoded in a PN code whose index is equal to 0. Thus, for example, once the base unit 10 receives the request signaling message signal from the remote unit 40, the base unit 10 may instruct that subsequent communication be affected using a PN code whose index equals to 10. The PN code used during the communication of the data can have a different structure from the PN code for the SYNC signal. In the preferred embodiment, the PN code is 65,535 chips long with alternate chips for the in-phase signal and the quadrature-phase signal, respectively. For each phase there are 16 chips per bit. The message of PN code index equal to 10 is then encoded by the PN code whose index equals 0 and is transmitted over the CSC-B time slot, and more particularly in the DATA time slot. (If the base unit 10 is in simultaneous communication with another remote unit 40, a different PN code will be assigned to the communication with that remote unit 40.)

The remote unit 40 receives the signal from the base unit 10 in the DATA portion of the CSC-B time slot and decodes the information contained therein. Thereafter, the message portion of the communication between the base unit 10 and the remote unit 40 is affected using a PN code whose index equals to 10 with the base unit 10 transmitting in its UC-B portion and with the remote unit 40 transmitting over its UC-R portion.

In the process of entering the STANDBY mode from the OFF mode the PCU 52 generates the frequency select signal for the synthesizer 74 to scan the frequency channels (0–20), and the code select signal for the PN code generator 134 for the SSU 34 to look for a PN whose index equals to 0. The frequency select signal is changed periodically as the preamble MF 102 fails to find a match in the SYNC signal. Once the SYNC signal is found, the remote unit 40 stays in the STANDBY mode and only the SSU 34 is active.

The communication between a base unit 10 and a plurality of remote units 40 is similar to the foregoing. If a remote unit 40 desires to initiate the communication session (it's on) or the remote unit 40 is in the standby mode, it scans the frequency channels looking for the SYNC pulse. It would then transmit in the CS-R portion of the CSC-R. The base unit 10 transmits an assignment signaling message with a specific PN code index in the DATA portion of the CSC-B timing portion. Thereafter, the PN code assigned by the base unit 10 is used both for transmissions in the UC-B portion and the UC-R portion. Thus, as can be seen from the foregoing, each remote unit 40 acquires the common signal channel portion, the CSC-R portion only momentarily. Thereafter, it is free for other remote units 40 to signal the base unit 10 over the CSC-R portion. Once the remote unit 40 has been assigned its PN code, communication between the base unit 10 and the remote unit 40 over that assigned PN code would not interfere with communication between the base unit 10 and the plurality of other remote units 40 over the same slotted time period (because the PN codes are different).

INTERFERENCE

Because the frequency spectrum (902–928 MHz) selected for operation is subject to interference from other RF generating sources, such as microwave apparatus, etc., the communication link between a base unit 10 and one or more of the remote units 40 is subject to interference. However, as can be seen from the foregoing, the communication between a base unit 10 and all of its remote units 40 is effected over a single selected frequency channel. In the event the base unit 10 detects the signal from one or more of the remote units 40 is being subjected to excessive interference, the base unit 10 would transmit in the DATA portion of the USC-B portion a signaling message to each of the remote units 40 to move to a different frequency channel. The signaling message would contain the synchronization or clocking information as to when the switch over is to occur. Upon receipt by each of the remote units 40, the PCU 52 would generate the frequency select signal to move to the new selected frequency channel.

LOSS OF COMMUNICATION LINK

Although the foregoing described mechanism for moving the communication from one frequency channel to another works to avoid interference and to continue the communication link, there may occur occasions in which the communication link between the base unit 10 and one or more of the remote units 40 is severed due to causes such as unexpected large magnitude of interference signals. In that event, it is necessary to establish a procedure to re-establish the communication link between the base unit 10 and one or more of the remote units 40.

As part of the establishment of the communication link procedure, prior to the base unit 10 and the remote unit 40 communicating in their respective UBC-B and UBC-R portions, the base unit 10 will have transmitted to each of the remote units 40 a table of channels of communications to be used in the event of a communication break. The table of channels would be communicated from the base unit 10 via the DATA portion of the USC-B to the remote unit 40. The table of channels would comprise a list including both the frequency channel and the index of the PN code.

The table of channels would be encoded in accordance with the selected PN code index, e.g. PN code index not equal to 0. The table of channels would be transmitted by the base unit 10 as if it were another piece of "data". The remote unit 40 receiving the table of channels would decode the table of channels in accordance with the assigned PN code. The decoded table of channels signals would then be stored in the memory portion of the protocol and control unit 52.

In the event of a break in communication, the remote unit 40 would continue to count clock signals based upon the system clock 35 generated internal to the SSU 34. The system clock 35 would continue to count in synchrony in continuation of the SYNC signals transmitted from the base unit 10. The protocol and control unit 52 would receive the signals from the system clock 35. The protocol and control unit 52 being a microcontroller, would apply a mathematical function to the value of the clock signal. One example of a mathematical function which is used by the remote unit 40 is a hash function H(T). The hash function H(T) maps the frame number T, derived from the clock signal, into a program number H(T). The preferred embodiment of the hash function H(T) is defined as $$H(T) = \lfloor R(T) \times B \rfloor$$

where:

⌊...⌋ is a floor function;

R(T) = (((T/8)×7)+3)mod 16)/16, and is a pseudo-random value in the range (0,1);

B is the number of entries in table of channels.

R(T) is based upon taking the minor super frame number T/8 as the seed for a maximum length sequence generator of modulus 16, multiplied by 7, then incremented by 3, and then normalized to obtain a pseudo-random value in the range (0,1).

The application of the mathematical function by the remote unit 40 to the value of the clock signal results in an entry in the table of channels. The protocol and control unit 52 would then select the channel of communication which is associated with that selected entry in the table. As previously discussed, the entry in the table of channels of communication selected would have an associated frequency channel and a PN code index.

In the meantime, the base unit 10 would also have continued the generation of its clock signal by its associated system clock 35. The protocol and control unit 32 would apply the same mathematical function to the same value of the clock signal from the system clock 35 to obtain an identical entry in the table of channels of communication. The base unit 10 would then select the channel of communication associated with the entry in the table. Communication would then be re-established over the channel of communication selected from the entry in the table of channels of communication.

ESTABLISHING CAPABILITIES

As part of the initial protocol between the base unit 10 and one or more of the remote units 40, once the remote unit 40 has locked on to the SYNC signal in the CSC-B portion of the time slot, it transmits a request signaling message in the CS-R portion of the CSC-R. Thereafter, the base unit 10 transmits in its DATA portion of the CSC-B time slot, the index of the particular PN code for use by the remote unit 40 in its communication session with the base unit 10.

The remote unit 40 would then decode this and use the selected PN code to transmit a list of its functional capabilities to the base unit 10. Thus, the remote unit 40 would transmit its list of functional capabilities, encoded by the selected PN code, e.g. PN code index=10, over the time slot USC-R.

The base unit 10 would receive the message in the USC-R time slot and would decode the signal in accordance with the selected PN code to derive the list of functional capabilities of the remote unit 40. The base unit would then compare the list of functional capabilities of the remote unit 40 to its functional capabilities and determine a common set of functional capabilities. The base unit 10 would then transmit the list of the common functional set of capabilities over the DATA portion of the USC-B time slot to the remote unit 40, encoded in the accordance with the selected PN code. Thereafter, communication between the remote unit 40 and the base unit 10 is accomplished using the set of common functional capabilities, in accordance with the selected PN code, in the selected frequency.

The functional capabilities of the remote unit 40 and of the base unit 10 can include capabilities such as speech digital encoding. Because different speech encoding techniques are available (some based upon generally known principles and others based upon principles proprietary to certain manufacturers), and since it is desired that remote units 40 from different manufacturers have the capability of communicating with the base unit 10 from different manufacturers based at least on their common functional capabilities, it is desired as part of the establishment of the communication link that the remote unit 40 and the base unit 10 know the common functional capabilities of each other.

Set forth below is an example of the functional capabilities for the speech codec of the base unit 10 and of the remote unit 40.

| Base Unit 10 | Remote Unit 40 |
| --- | --- |
| 32 Kbps ADPCM | 32 Kbps ADPCM |
| 32 Kbps Enhanced | |
| 16 Kbps Subband | 16 Kbps Subband |
| 8 Kbps CELP | Proprietary |

As can be seen, from the list of functional capabilities from the remote unit 40, the base unit 10 compares the table and determines that the list of corresponding common capabilities include the 16 Kbps Subband and the 32 Kbps ADPCM. Based upon the comparison, the base unit 10 would transmit this list of functional capabilities to the remote unit 40 and communication would be effected using either of those two functional capabilities for the speech codec.

Because the remote unit 40 and the base unit 10 have the ability to "negotiate" a list of common capabilities, manufacturers having proprietary speech encoding techniques for their base unit 10 or their remote unit 40, can communicate with other manufacturer's remote units 40 or base units 10—so long as there is a common denominator of at least one speech codec functional capability which is supported by both manufacturer's units.

POWER CONTROL

Because the base unit 10 can be in communication with a plurality of remote units 40, it is desired that the base unit 10 have control over the transmission power of each of the remote units 40 in order to ensure that the signal strength from each of the remote units 40 as received by the base unit 10 is approximately the same so that one remote unit 40 does not overpower or dominate the other units. Further, power control is desirable to suppress multipath fading and shadowing distortion.

In the present communication system 8 the signal transmitted by the base unit 10 is received by the remote unit 40. The power of the signal received from the base unit 10 is measured by the remote unit 40 by detector 104 of the BPU 28a. The transmission power of the remote unit 40 is then controlled in accordance with the following formula:

$$Power = A + (B - C)$$

where

A is representative of the desired power received by the base unit 10, of the signal transmitted by the remote unit 40, B is representative of the power of the signal transmitted by the base unit 10, and C is the measured power of the signal received by the remote unit 40 as measured by the detector 104 of the Baseband Processing Unit 28a. A and B values are data transmitted from the base unit 10 to the remote unit 40 in order to control the transmission power of the remote unit 40. A is the desired power received by the base unit 10 of the signal transmitted by the remote unit 40, as measured by the detector 104 of the base unit 10. It is a value that is transmitted from the base unit 10 to the remote unit 40 over the DATA portion of the USC-B. B represents the power of the signal transmitted by the base unit 10. That too is transmitted from the base unit 10 to the remote unit 40 over the DATA portion of the USC-B. Thus, A and B are known a priori to the remote unit 40 or are part of the signaling message transmitted from the base unit 10 to the remote unit 40.

The gain control signal generated by the protocol and control unit 52 in the remote unit 40 is used to control the gain of the RF filter and amplifier 90 which affects the power of the transmitted signal. The RF amplifier 90 whose gain is controlled can be of well known design, such as that from part AN1025, made by Motorola.

DATA ENCODING

As previously discussed, both the UC-B portion as well as the UC-R portion consist of a USC and a UBC portion. Thus, in the UC-B time slot, the signals USC-B and UBC-B are transmitted, with USC-B being a control signal portion containing information such as power activity, ringing status etc. and with the UBC-B portion containing the data. Similarly, in the UC-R portion, the UC-R portion consists of the PA2 and USC-R portion which are control signals with UBC-R being the data portion.

The control signal portion of the UC-B and the UC-R are digital data streams having a small amount of digital data in comparison to the data portion of the UC-B and UC-R. To protect the control signal portion to further enhance the ability of the control signal portion to withstand interference, the control signal and the data portion of both the UC-B and the UC-R can be further digitally encoded.

The encoding for that digital data is as follows. Each N bit block from the data portion is mapped to a unique "light" (wherein light means there are fewer ones than zeroes) M-bit signal where M is greater than N and the number of "1's" in the M-bit signal is less than M/2. The light M-bit signal is transmitted in the event a bit from the control signal portion of UC-B or UC-R is "0", whereas complement of the light M-bit signal is transmitted in the event the bit from the control signal portion of the UC-B or UC-R is "1".

While channel coding is increasingly common in modern communication systems, a channel code merely adds redundancy to an informational stream producing an encoded bit stream for transmission on a noisy channel. If the channel code is properly devised, the decoder can reliably recover the original information stream even though some of the transmitted bits were received in error due to the redundancy introduced by the coding.

In the present apparatus, the objective of the encoding is to provide maximal protection against transmission errors for the control signal portion of the UC-B or the UC-R time slot and minimal protection for the data portion of the UC-B or UC-R. In this way, the received unit (remote unit 40 or the base unit 10) will be able to recover both the control signal and the data signal under conditions of low error rate and will be able to recover the control signals under conditions of extremely high error rate.

The following illustrates an example of the foregoing encoding techniques. A single bit of the control signal and 96 bits of data are encoded into an encoded bit stream having 120 bits for transmission. Mapping from the 96 bit words to the 120 bit words is accomplished by splitting the 96 bit words into three 32 bit words. Each of the 32 bit words is mapped into a light 40 bit word. The three light 40 bit words are concatenated to form a light 120 bit word.

Mathematically, $2^{32}$ is less than the combination of C (40, 12), so the sequence of 32 bits can be mapped into a sequence of 40 bits having a Hamming weight of 12, i.e. containing exactly twelve 1's.

Three 40 bit words mapped from the three 32 bit input words from the data channel are concatenated to result in a 120 bit word of Hamming weight 36. If the single bit from the control signal is 0, this word is sent. If the single bit from the control signal is 1, the complement of this word is sent, and has a weight of 120 −36 = 84 bits of "1".

The difference in weight is 84 −36=48 which means that more than 24 of the 120 bits must be in error before a "light" M bit word is mistaken for a "heavy" M-bit word or vice versa.

The foregoing example has the drawback that any channel error will cause loss of one 32 bit portion of the encoded data. This can be improved through the addition of an ordinary single stream (127,120) Hamming code. Adding the 7 cycle redundancy check (CRC) bits to the 120 bit word enables correction of any single bit error in the 127 bit block. With this improvement, the decoding will produce correct results for both control and data signals if fewer than 2 bits are changed by noise.

What is claimed is

1. A method of encoding two digital data signals: a first signal and a second signal, for transmission over a noisy channel, wherein each signal is characterized by a bit stream, said method comprising the steps of:

mapping N bits of the first signal to a M bit (M>N) third signal wherein the number of "1"s is the M bit third signal is less than M/2 and wherein said M bit third signal has a complement; and transmitting said M bit third signal mapped from the N bits of the first signal, in the event a bit from the second signal is "0", and transmitting the complement of said M bit third signal mapped from the N bits of the first signal in the event a bit from the second signal is "1".

2. The method of claim 1 further comprising the steps of:

encoding said M bit third signal with an error correction code, prior to transmission.

3. The method of claim 2 wherein said transmitting step further comprising:

transmitting a plurality of concatenated M bit third signals, with each contiguous M bit third signal mapped from a contiguous N bit portion of the first signal.

4. The method of claim 3 further comprising the step of:

encoding said plurality of M bit third signals with an error correction code, prior to transmission.

5. A method of decoding a digital data signal, characterized by a bit stream, into a first digital signal and a second digital signal, wherein said decoding step comprises:

receiving M bits of said digital data signal;

outputting a "0" as said second digital signal in the event the number of "1"s in the M bits is less than M/2; and said "1" as a second digital signal in the event the number of "1"s in the M bits is greater than M/2; and mapping said received M bits to N bits as said first digital signal.

6. The method of claim 5 wherein said mapping step further outputs an error signal in the event the received M bits are unable to be mapped to the N bits.

7. A method of transmitting and receiving two digital data signals: a first signal and a second signal over a noisy channel, wherein each signal is characterized by a bit stream, said method comprising the steps of:

mapping N bits of the first signal to a M bit (M>N) third signal wherein the number of "1"s in the M bit third signal is less than M/2 and wherein said M bit third signal has a complement;

transmitting over the channel the M bit third signal mapped from the N bits of the first signal, in the event a bit from the second signal is "0" and transmitting over the channel the complement of the M bit third signal mapped from the N bits of the first signal, in the event a bit from the second signal is "1";

receiving M bits from the channel;

outputting a "0" as the second signal in the event the number of "1"s in the M bits is less than M/2, and a "1" as the second signal in the event the number of "1"s in the M bits is greater than M/2; and mapping said received M bits to N bits as said first signal.

8. The method of claim 7 wherein said mapping step further outputs an error signal in the event the received M bits are unable to be mapped to the N bits.

9. A method of operating a digital cordless phone having a base unit and a remote unit, said method for communicating wirelessly between the base unit and the remote unit, said base unit transmitting a digital control signal and a digital data signal, over a channel, wherein each signal is characterized by a bit stream, said method comprising the steps of:

mapping N bits of the digital data signal to a M bit (M>N) transmission signal wherein the number of "1"s in the M bit transmission signal is less than M/2 and wherein said M bit transmission signal has a complement; and transmitting the M bit transmission signal mapped from the N bits of the digital data signal, in the event a bit from the digital control signals is "0" and transmitting the complement of the M bit transmission signal mapped from the N bits of the digital data signal, in the event a bit from the digital control signal is "1".

10. The method of claim 9 further comprising the step of:

encoding said M bit transmission signal with an error correction code, prior to transmission.

11. The method of claim 10 wherein said transmitting step further comprising:

transmitting a plurality of concatenated M bit transmission signals, with each contiguous M bit transmission signal mapped from a contiguous N bit portion of the digital data signal.

12. The method of claim 11 further comprising the steps of:

encoding said plurality of M bit transmission signals with an error correction code, prior to transmission.

13. The method of claim 9 wherein said remote unit decodes a received digital data signal, characterized by a bit stream, into a first digital signal and a second digital signal, wherein said decoding step comprising:

receiving M bits of said digital data signal;

outputting a "0" as said second digital signal in the event the number of "1"s in the M bits is less than M/2; and said "1" as a second digital signal in the event the number of "1"s in the M bits is greater than M/2; and mapping said received M bits to N bits as said first digital signal.

14. The method of claim 13 wherein said mapping step further outputs an error signal in the event the received M bits are unable to be mapped to the N bits.

* * * * *